(12) United States Patent
Kim et al.

(10) Patent No.: US 10,110,228 B2
(45) Date of Patent: Oct. 23, 2018

(54) SEMICONDUCTOR DEVICE

(71) Applicant: SK hynix Inc., Gyeonggi-do (KR)

(72) Inventors: Young-Hoon Kim, Gyeonggi-do (KR); Duck-Hwa Hong, Seoul (KR)

(73) Assignee: SK Hynix Inc., Gyeonggi-do (KR)

( * ) Notice: Subject to any disclaimer, the term of this patent is extended or adjusted under 35 U.S.C. 154(b) by 0 days.

(21) Appl. No.: 15/725,877

(22) Filed: Oct. 5, 2017

(65) Prior Publication Data
US 2018/0248549 A1     Aug. 30, 2018

(30) Foreign Application Priority Data

Feb. 28, 2017  (KR) .................. 10-2017-0026200

(51) Int. Cl.
| | |
|---|---|
| *H03K 19/003* | (2006.01) |
| *H03K 5/1534* | (2006.01) |
| *H03K 19/21* | (2006.01) |

(52) U.S. Cl.
CPC ..... *H03K 19/00323* (2013.01); *H03K 5/1534* (2013.01); *H03K 19/21* (2013.01)

(58) Field of Classification Search
None
See application file for complete search history.

(56) References Cited

U.S. PATENT DOCUMENTS

| | | | |
|---|---|---|---|
| 2004/0225976 A1* | 11/2004 | Cheung | H03K 5/131 716/113 |
| 2006/0136769 A1* | 6/2006 | Kizer | G06F 13/1689 713/401 |
| 2015/0063044 A1* | 3/2015 | Byun | G11C 7/22 365/193 |

FOREIGN PATENT DOCUMENTS

KR     1020150043634     4/2015

\* cited by examiner

*Primary Examiner* — Jany Richardson
(74) *Attorney, Agent, or Firm* — IP & T Group LLP (57) ABSTRACT

A semiconductor device may include: a first circuit suitable or generating a limit strobe signal by limiting a toggling period of a strobe signal depending on a change of an input code signal; and a second circuit suitable for synchronizing the input code signal based on the limit strobe signal and outputting a synchronized input code signal as an output code signal.

21 Claims, 7 Drawing Sheets

SEMICONDUCTOR DEVICE

CROSS-REFERENCE TO RELATED APPLICATION

This application claims priority under 35 U.S.C. § 119 to Korean Patent Application No. 10-2017-0026200 filed on Feb. 28, 2017, the disclosure of which is herein incorporated by reference in its entirety.

TECHNICAL FIELD

Exemplary embodiments of the present disclosure relate to a semiconductor design technology, and more particularly, a semiconductor device.

DISCUSSION OF THE RELATED ART

Generally, a semiconductor device may synchronize a data signal generated regardless of a dock signal according to a strobe signal based on the clock signal. For example, the semiconductor device may latch the data signal when the strobe signal makes a transition.

However, when a timing margin is not secured between the data signal and the strobe signal, the data signal may not be normally latched. If the strobe signal and the data signal are transitioned at similar timings, the data signal is randomly latched as any one of 'low logic value (0)' and 'high logic value (1)'.

SUMMARY

Various embodiments are directed to a semiconductor device capable of always normally synchronizing signal inputted or generated regardless of a clock signal.

In an embodiment, a semiconductor device may include: a first circuit suitable for generating a limit strobe signal by limiting a toggling period of a strobe signal depending on a change of an input code signal; and a second circuit suitable for synchronizing the input code signal based on the limit strobe signal and outputting a synchronized input code signal as an output code signal.

The first circuit may detect whether the input code signal has been transitioned each time the strobe signal toggles, and selectively limit a toggling period of one cycle of the strobe signal depending on a result of the detection.

The first circuit may include a delay block suitable for generating a delay strobe signal by delaying the strobe signal by a predetermined delay time; a detection block suitable for detecting whether the input code signal has been transitioned based on the strobe signal and the delay strobe signal, and generating a detection code signal corresponding to a result of the detection; and a limit block suitable for selectively limiting a toggling period of the delay strobe signal based on the detection code signal.

The delay time may be set to be longer than a transition time of the input code signal.

The detection block may include at least one transition detection unit, and the transition detection unit may include: a first latch suitable for latching one or more input signals included in the input code signal as a first latch signal based on the strobe signal; a second latch suitable for latching the input signal as a second latch signal based on the delay strobe signal; and a comparator suitable for comparing a logic level of the first latch signal with a logic level of the second latch signal and generating one or more detection signals included in the detection code signal.

The limit block may include: a gating control unit suitable for generating a gating control signal based on the detection code signal; a compensation unit suitable for generating a compensation strobe signal by compensating for an output timing of the delay strobe signal by a time corresponding to an operating time of the gating control unit; and a gating unit suitable for generating the limit strobe signal by gating the compensation strobe signal based on the gating control signal.

The second circuit may retain a preceding value of the input code signal based on the limit strobe signal, or latch a current value of the input code signal.

In an embodiment, a semiconductor device may include: a first circuit suitable for generating a delay strobe signal by delaying a strobe signal by a first delay time or a second delay time depending on a transition of an input code signal; and a second circuit suitable for synchronizing the input code signal based on the delay strobe signal and outputting a synchronized input code signal as an output code signal.

The first circuit may detect whether the input code signal has been transitioned each time the strobe signal toggles, and delay the strobe signal by the first delay time or the second delay time depending on a result of the detection.

The first circuit may include: a delay block suitable for generating a first delay strobe signal by delaying the strobe signal by the first delay time, and generating a second delay strobe signal by delaying the strobe signal by the second delay time; a detection block suitable for detecting whether the input code signal has been transitioned based on the strobe signal and the first delay strobe signal, and generating a detection code signal corresponding to a result of the detection; and a select block suitable for selecting any one of the first delay strobe signal and the second delay strobe signal as the delay strobe signal based on the detection code signal.

The first delay time may be set to be longer than a transition time of the input code signal, and the second delay time may be set to be longer than the first delay time.

The delay block may include: a first delay unit suitable for generating the first delay strobe signal by delaying the strobe signal by the first delay time; and a second delay unit suitable for generating the second delay strobe signal by delaying the first delay strobe signal by a third delay time including a time obtained by subtracting the first delay time from the second delay time.

The detection block may include at least one transition detection unit, and the transition detection unit may include: a first latch suitable for latching one or more input signals included in the input code signal as a first latch signal based on the strobe signal; a second latch suitable for latching the input signal as a second latch signal based on the delay strobe signal; and a comparator suitable for comparing a logic level of the first latch signal with a logic level of the second latch signal and generating one or more detection signals included in the detection code signal.

The select block may include: a select control unit suitable for generating a select control signal based on the detection code signal; and a select unit suitable for selecting any one of the first delay strobe signal and the second delay strobe signal as the delay strobe signal based on the select control signal.

In an embodiment, a semiconductor device may include: a first circuit suitable for generating a tuning strobe signal by limiting a toggling period of a strobe signal or generating the tuning strobe signal by delaying the strobe signal by a predetermined delay time, based on a mode select signal and an input code signal; and a second circuit suitable for synchronizing the input code signal based on the tuning strobe signal and outputting an output code signal.

The first circuit may include: a delay block suitable for generating a first delay strobe signal by delaying the strobe signal by the first delay time, and generating a second delay strobe signal by delaying the strobe signal by the second delay time; a detection block suitable for detecting whether the input code signal has been transitioned based on the strobe signal and the first delay strobe signal, and generating a detection code signal corresponding to a result of the detection; a tuning block suitable for generating a limit strobe signal in which a toggling period of the first delay strobe signal is selectively limited, based on the first and second delay strobe signals and the detection code signal, and generating a delay strobe signal corresponding to any one of the first delay strobe signal and the second delay strobe signal; and a select block suitable for selecting any one of the limit strobe signal and the delay strobe signal as the tuning strobe signal based on the mode select signal.

The detection block may detect whether the input code signal has been transitioned each time the strobe signal toggles, and the tuning block generate the limit strobe signal by selectively limiting a toggling period of one cycle of the strobe signal, based on the detection code signal, and generate the delay strobe signal by delaying the strobe signal by the first delay time or the second delay time.

The detection block may include at least one transition detection unit, and the transition detection unit may include: a first latch suitable for latching one or more input signals included in the input code signal as a first latch signal based on the strobe signal; a second latch suitable for latching the input signal as a second latch signal based on the first delay strobe signal; and a comparator suitable for comparing a logic level of the first latch signal with a logic level of the second latch signal and generating one or more detection signals included in the detection code signal.

The tuning block may include: a common control unit suitable for generating a common control signal based on the detection code signal; a compensation unit suitable for generating a compensation strobe signal by compensating for an output timing of the first delay strobe signal by a time corresponding to an operating time of the common control unit; a gating unit suitable for generating the limit strobe signal by gating the compensation strobe signal based on the common control signal; and a select unit suitable for selecting any one of the first delay strobe signal and the second delay strobe signal as the delay strobe signal based on the common control signal.

The first delay time may be set to be longer than a transition time of the input code signal, and the second delay time may be set to be longer than the first delay time.

When the limit strobe signal may be selected as the tuning strobe signal, the second circuit may retain a preceding value of the input code signal or latches a current value of the input code signal, based on the tuning strobe signal.

DETAILED DESCRIPTION

Various embodiments will be described below in more detail with reference to the accompanying drawings. The present disclosure may, however, be embodied in different forms and should not be construed as limited to the embodiments set forth herein. Rather, these embodiments are provided so that this disclosure will be thorough and complete and will fully convey the scope of the present disclosure to those skilled in the art. Throughout the disclosure, like reference numerals refer to like parts throughout the various figures and embodiments of the present disclosure.

The terminology used herein is for the purpose of describing particular embodiments only and is not intended to be limiting of the inventive concept. As used herein, singular forms are intended to include the plural forms as well, unless the context clearly indicates otherwise. It will be further understood that the terms "comprises," "comprising," "includes," and/or "including" when used in this specification, indicate the presence of stated features, but do not preclude the presence or addition of one or more other features. As used herein, the term "and/or" indicates any and all combinations of one or more of the associated listed items.

It will be understood that, although the terms "first", "second", "third", and so on may be used herein to describe various elements, these elements are not limited by these terms. These terms are used to distinguish one element from another element. Thus, a first element described below could also be termed as a second or third element without departing from the spirit and scope of the present invention.

Figure 1:
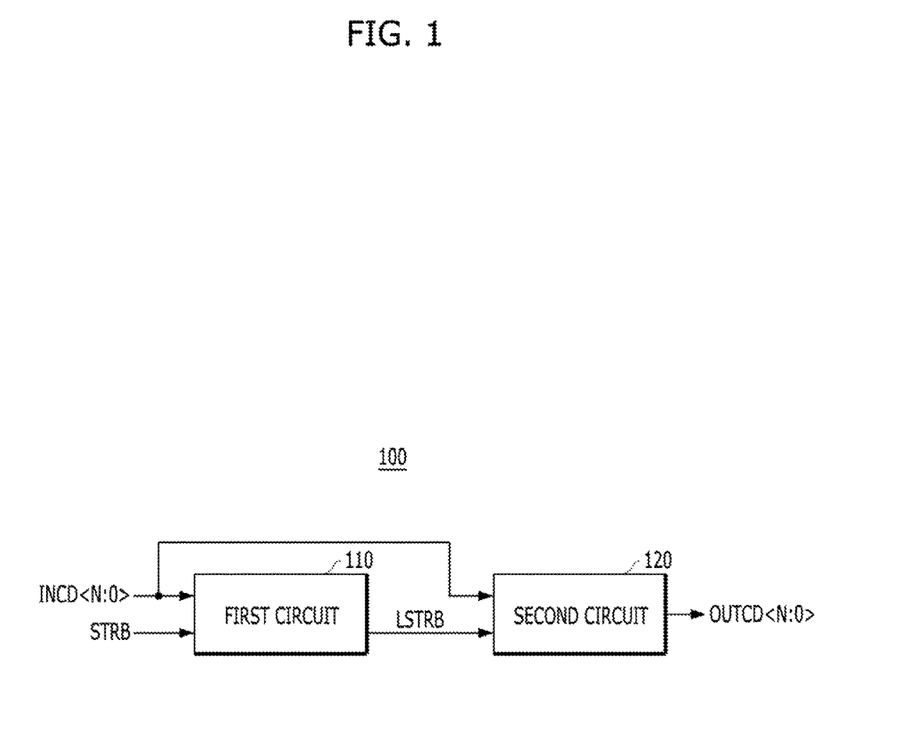
FIG. 1 is a block diagram of a semiconductor device in accordance with a first embodiment.

In FIG. 1, there is illustrated a block diagram of a semiconductor device 100 in accordance with a first embodiment.

Referring to FIG. 1, the semiconductor device 100 may include a first circuit 110, and a second circuit 120.

The first circuit 110 may generate a limit strobe signal LSTRB by limiting a toggling period of a strobe signal STRB depending on a change of an input code signal INCD<N:0>. For example, the first circuit 110 may detect whether the input code signal INCD<N:0> has been transitioned each time the strobe signal STRB toggles, and may selectively limit a toggling period of one cycle of the strobe signal STRB depending on a result of the detection.

In some embodiments, the input code signal INCD<N:0> may be a data signal which is generated regardless of a dock signal, and the strobe signal STRB may be generated based on the dock signal. For example, the input code signal INCD<N:0> may include a temperature code signal which is periodically generated and updated from a temperature sensor (not shown).

The second circuit 120 may synchronize the input code signal INCD<N:0> based on the limit strobe signal LSTRB and output an output code signal OUTCD<N:0>. For example, based on the limit strobe signal LSTRB, the second circuit 120 may latch a preceding value of the input code signal INCD<N:0> as the output code signal OUTCD<N:0>, or latch a current value of the input code signal INCD<N:0> as the output code signal OUTCD<N:0>.

Figure 2:
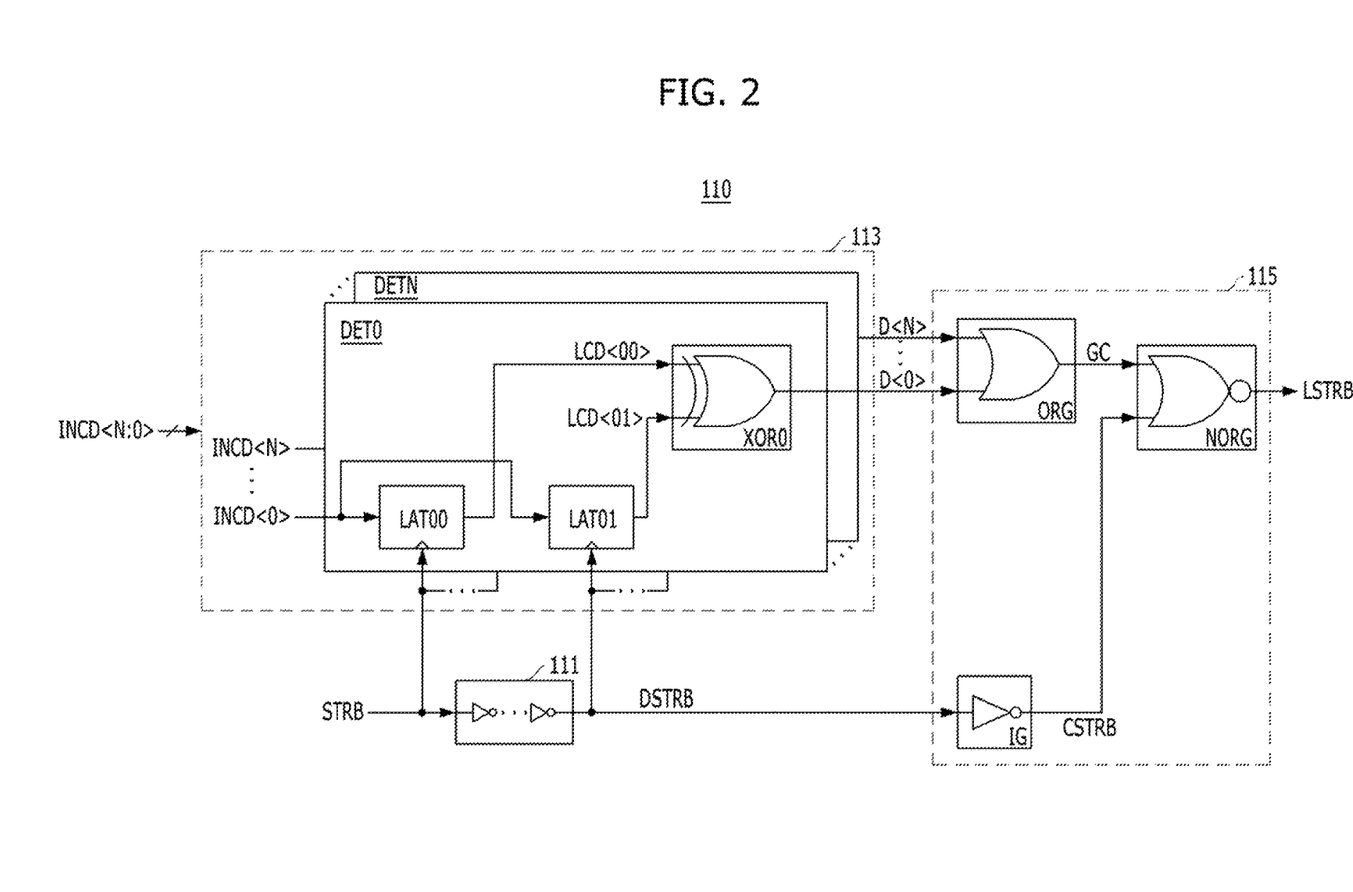
FIG. 2 is a circuit diagram of a first circuit shown in FIG. 1.

In FIG. 2, there is illustrated a circuit diagram of the first circuit 110 shown in FIG. 1.

Referring to FIG. 2, the first circuit 110 may include a delay block 111, a detection block 113, and a limit block 115.

The delay block 111 may generate a delay strobe signal DSTRB by delaying the strobe signal STRB by a predetermined delay time. In some embodiments, the delay time may be set to be longer than a transition time of the input code signal INCD<N:0>.

The detection block 113 may detect whether the input code signal INCD<N:0> has been transitioned, based on the strobe signal STRB and the delay strobe signal DSTRB, and may generate a detection code signal D<N:0> corresponding to a result of the detection. For example, the detection block 113 may include first to (N+1)-th transition detection units DET0 to DETN. The first to (N+1)-th transition detection units DET0 to DETN may respectively generate first to N+1-th detection signals included in the detection code signal D<N:0>, based on first to (N+1)-th input signals INCD<N:0> included in the input code signal INCD<N:0>. The first to (N+1)-th transition detection units DET0 to DETN have the same configuration as each other; therefore, hereinbelow, only the first transition detection unit DET0 will, be described as a representative example.

The first transition detection unit DET0 may include a first latch LAT00, a second latch LAT01, and a comparator XOR0. The first latch LAT00 may latch the first input signal INCD<0> as a first latch signal LCD<00> based on the strobe signal STRB. The second latch LAT01 may latch the first input signal INCD<0> as a second latch signal LCD<01> based on the delay strobe signal DSTRB. The comparator XOR0 may compare a logic level of the first latch signal LAT<00> and a logic level of the second latch signal LAT<01> and generate a first detection signal D<0> corresponding to a result of the comparison. If the result of the comparison indicates that the logic level of the first latch signal LAT<00> is the same as the logic level of the second latch signal LAT<01>, the comparator XOR0 may generate a first detection signal D<0> indicating that the first input signal INCD<0> has not been transitioned. If the result of the comparison indicates that the logic level of the first latch signal LAT<00> is different from the logic level of the second latch signal LAT<01>, the comparator XOR0 may generate a first detection signal D<0> indicating that the first input signal INCD<0> has been transitioned. For example, the comparator XOR0 may include an exclusive-OR gate.

The limit block 115 may selectively limit a toggling period of the delay strobe signal DSTRB based on the detection code signal D<N:0>. For example, the limit block 115 may include a gating control unit ORG, a compensation unit IG, and a gating unit NORG. The gating control unit ORG may generate a gating control signal GC based on the detection code signal D<N:0>. For example, the gating control unit ORG may include an OR gate. The compensation unit IG may generate a compensation strobe signal CSTRB by compensating for an output timing of the delay strobe signal DSTRB by a time corresponding to an operating time of the gating control unit ORG. For instance, the compensation unit IG may include one or more inverters coupled in series. The gating unit NORG may generate a limit strobe signal LSTRG by gating the compensation strobe signal CSTRB based on the gating control signal GC. For example, the gating unit NORG may include an NOR gate.

Hereinafter, the operation of the semiconductor device 100 in accordance with the first embodiment having the above-mentioned configuration will be described with reference to FIG. 3.

Figure 3:
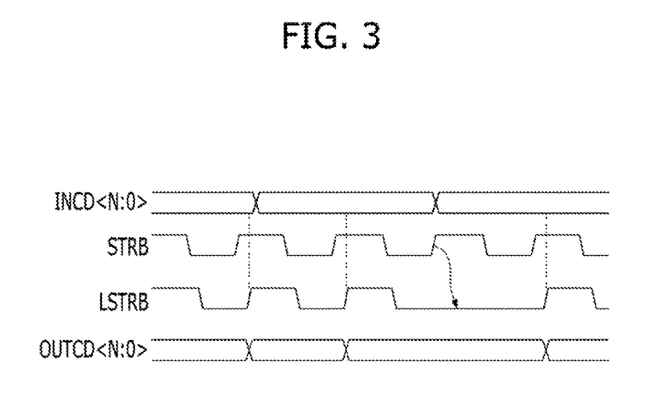
FIG. 3 is a timing diagram illustrating operation of the semiconductor device shown in FIG. 1.

In FIG. 3, a timing diagram illustrates the operation of the semiconductor device 100 shown in FIG. 1.

Referring to FIG. 3, the first circuit 110 may receive a strobe signal STRB and an input code signal INCD<N:0>. The strobe signal STRB continuously toggles, and the input code signal INCD<N:0> is periodically updated at a time regardless of the strobe signal STRB.

The first circuit 110 may detect whether the input code signal INCD<N:0> is updated each time the strobe signal STRB toggles. For example, the first circuit 110 detects whether one or more of the first to (N+1)-th input signals INCD<N:0> included in the input code signal INCD<N:0> is transitioned based on a rising edge of the strobe signal STRB.

The first circuit 110 may selectively limit the toggling period of the strobe signal STRB based on a result of the detection and thus generate a limit strobe signal LSTRB. If the result of the detection indicates that the input code signal INCD<N:0> has not been updated, the first circuit 110 may not limit a toggling period corresponding to one cycle of the strobe signal STRB. In this case, the first circuit 110 may generate a limit strobe signal LSTRB which toggles equally with the strobe signal STRB. In contrast, if the result of the detection indicates that the input code signal INCD<N:0> has been updated, the first circuit 110 may limit a toggling period corresponding to one cycle of the strobe signal STRB. In this case, the first circuit 110 may generate a limit strobe signal LSTRB having a low logic level.

The second circuit 120 may synchronize the input code signal INCD<N:0> based on the limit strobe signal LSTRB. If the limit strobe signal LSTRB toggles, the second circuit 120 may latch a current value of the input code signal INCD<N:0> corresponding to a rising edge of the limit strobe signal LSTRB as an output code signal OUTCD<N:0>. If the limit strobe signal LSTRB does not toggle, the second circuit 120 may continuously latch a preceding value of the input code signal INCD<N:0> as an output code signal OUTCD<N:0>.

Figure 4:
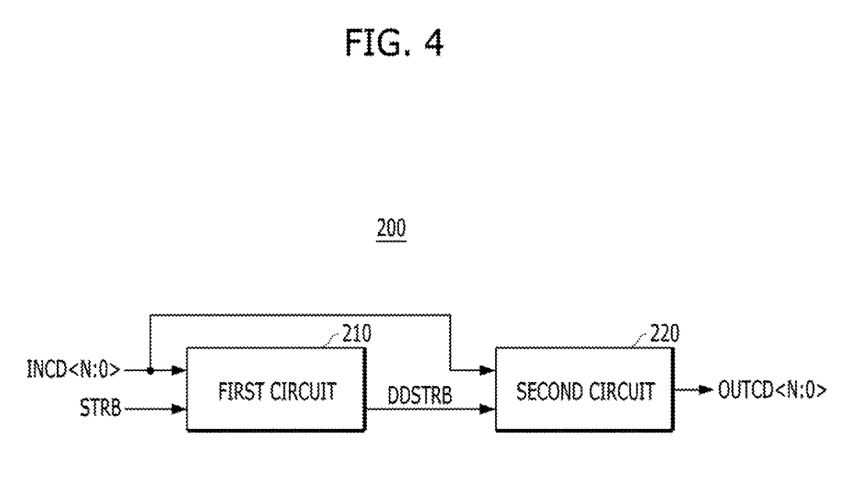
FIG. 4 is a block diagram of a semiconductor device in accordance with a second embodiment.

In FIG. 4, there is illustrated a block diagram of a semiconductor device 200 in accordance with a second embodiment.

Referring to FIG. 4, the semiconductor device 200 may include a first circuit 210, and a second circuit 220.

The first circuit 210 may generate a delay strobe signal DDSTRB by delaying a strobe signal STRB by a first delay time or a second delay time depending on a change of an input code signal INCD<N:0>. For example, the first circuit 210 may detect whether the input code signal INCD<N:0> has been transitioned each time the strobe signal STRB toggles, and may selectively delay the strobe signal STRB by the first delay time or the second delay time depending on a result of the detection. In some embodiments, the first delay time may be set to be longer than the transition time of the input code signal INCD<N:0>, and the second delay time may be set to be longer than the first delay time.

In some embodiments, the input code signal INCD<N:0> may be a data signal which is generated regardless of a clock signal, and the strobe signal STRB may be generated based on the dock signal. For example, the input code signal INCD<N:0> may include a temperature code signal which is periodically generated and updated from a temperature sensor (not shown).

The second circuit 220 may synchronize the input code signal INCD<N:0> based on the delay strobe signal DDSTRB and output an output code signal OUTCD<N:0>. For example, based on the delay strobe signal DDSTRB, the second circuit 220 may latch a preceding value of the input code signal INCD<N:0> as the output code signal OUTCD<N:0>, or may latch a current value of the input code signal INCD<N:0> as the output code signal OUTCD<N:0>.

Figure 5:
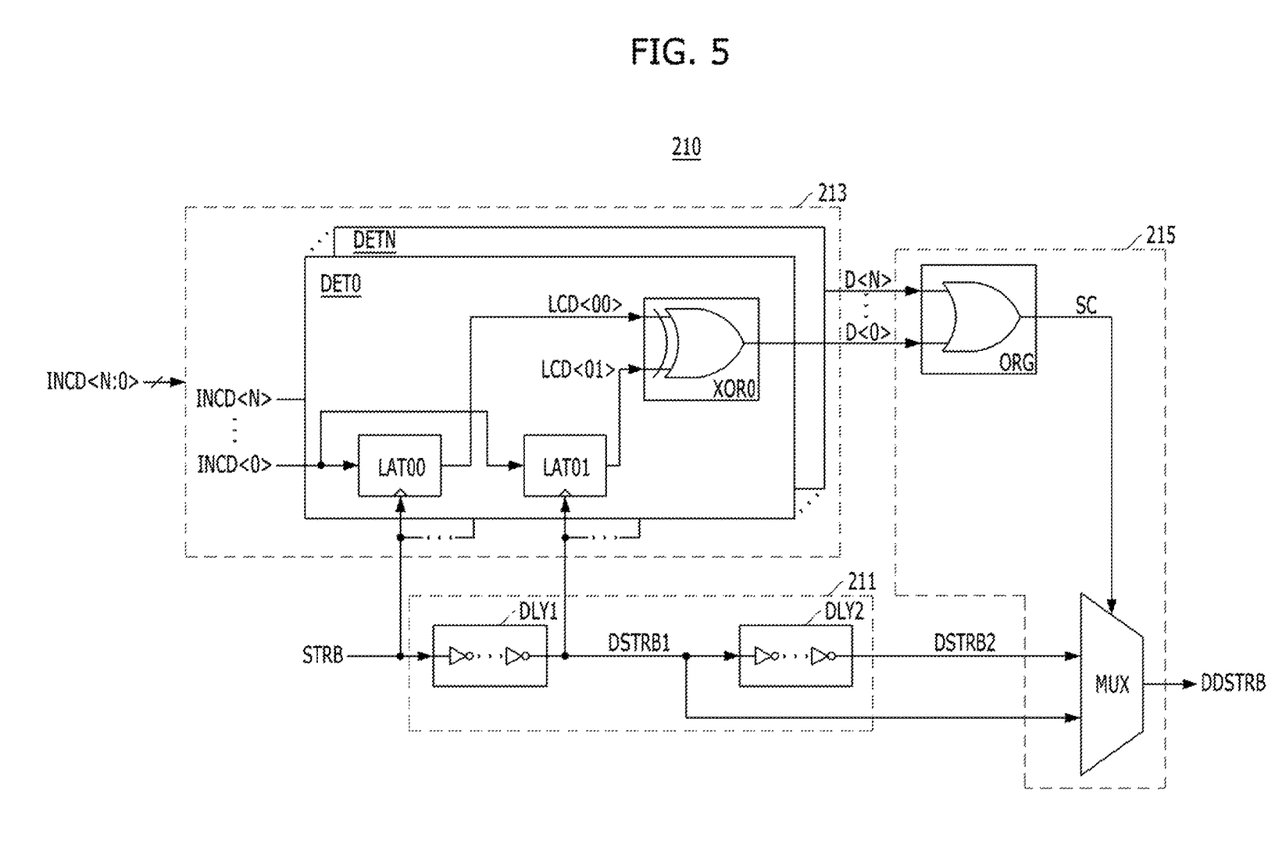
FIG. 5 is a circuit diagram of a first circuit shown in FIG. 4.

In FIG. 5, there is illustrated a circuit diagram of the first circuit 210 shown in FIG. 4.

Referring to FIG. 5, the first circuit 210 may include a delay block 211, a detection block 213, and a select block 215.

The delay block 211 may include a first delay unit DLY1, and a second delay unit DLY2. The first delay unit DLY1 may generate a first delay strobe signal DSTRB1 by delaying the strobe signal STRB by the first delay time. The second delay DLY2 may generate a second delay strobe signal DSTRB2 by delaying the first delay strobe signal DSTRB1 by a third delay time. The third delay time may include a time obtained by subtracting the first delay time from the second delay time.

The detection block 213 may detect whether the input code signal INCD<N:0> has been transitioned, based on the strobe signal STRB and the first delay strobe signal DSTRB1, and may generate a detection code signal D<N:0> corresponding to a result of the detection. For example, the detection block 213 may include first to (N+1)-th transition detection units DET0 to DETN. The first to (N+1)-th transition detection units DET0 to DETN may respectively generate first to N+1-th detection signals included in the detection code signal D<N:0>, based on first to (N+1)-th input signals INCD<N:0> included in the input code signal INCD<N:0>. The first to (N+1)-th transition detection units DET0 to DETN have the same configuration as those of the first to (N+1)-th transition detection units DET0 to DETN described in the first embodiment; therefore, detailed description thereof will be omitted.

The select block 215 may select either the first delay strobe signal DSTRB1 or the second delay strobe signal DSTRB2 as the delay strobe signal DDSTRB based on the detection code signal D<N:0>. For example, the select block 215 may include a select control unit ORG, and a select unit MUX. The select control unit ORG may generate a select control signal SC based on the detection code signal D<N:0>. For example, the select control unit ORG may include an OR gate. The select unit MUX may select either the first delay strobe signal DSTRB1 or the second delay strobe signal DSTRB2 as the delay strobe signal DDSTRB based on the select control signal SC. For example, the select unit MUX may include a multiplexer.

Hereinafter, the operation of the semiconductor device 200 in accordance with the second embodiment having the above-mentioned configuration will be described with reference to FIG. 6.

Figure 6:
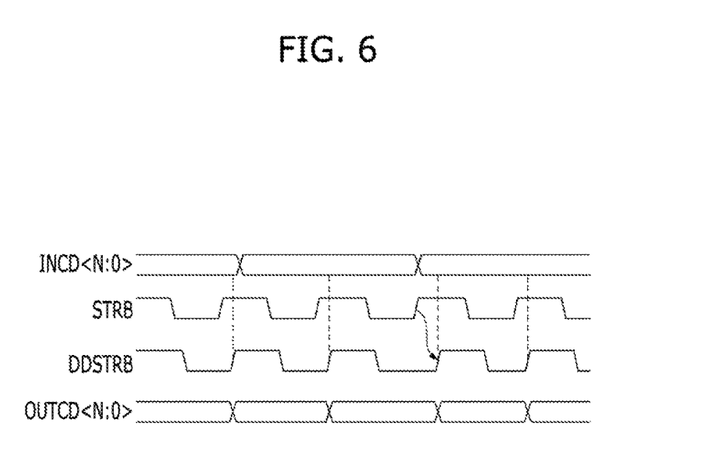
FIG. 6 is a timing diagram illustrating operation of the semiconductor device shown in FIG. 4.

FIG. 6 is a timing diagram illustrating the operation of the semiconductor device 200 shown in. FIG. 4.

Referring to FIG. 6, the first circuit 210 may receive a strobe signal STRB and an input code signal INCD<N:0>. The strobe signal STRB continuously toggles and the input code signal INCD<N:0> is periodically updated at a time period regardless of the strobe signal STRB which may be generated.

The first circuit 210 may detect whether the input code signal INCD<N:0> is updated each time the strobe signal STRB toggles. For example, the first circuit 210 detects whether one or more of the first to (N+1)-th input signals INCD<N:0> included in the input code signal INCD<N:0> is transitioned based on a rising edge of the strobe signal STRB.

The first circuit 210 may generate a delay strobe signal DDSTRB by delaying the strobe signal STRB by the first delay time or the second delay time for each toggling period based on a result of the detection. If the result of the detection indicates that the input code signal INCD<N:0> has not been updated, the first circuit 210 may generate a delay strobe signal DDSTRB delayed by the first delay time compared to the strobe signal STRB. In contrast, if the result of the detection indicates that the input code signal INCD<N:0> has been updated, the first circuit 210 may generate a delay strobe signal DDSTRB delayed by the second delay time compared to the strobe signal STRB.

The second circuit 220 may synchronize the input code signal INCD<N:0> based on the delay strobe signal DDSTRB. For example, the second circuit 220 may latch a current value of the input code signal INCD<N:0> corresponding to a rising edge of the delay strobe signal DDSTRB as an output code signal OUTCD<N:0>.

Figure 7:
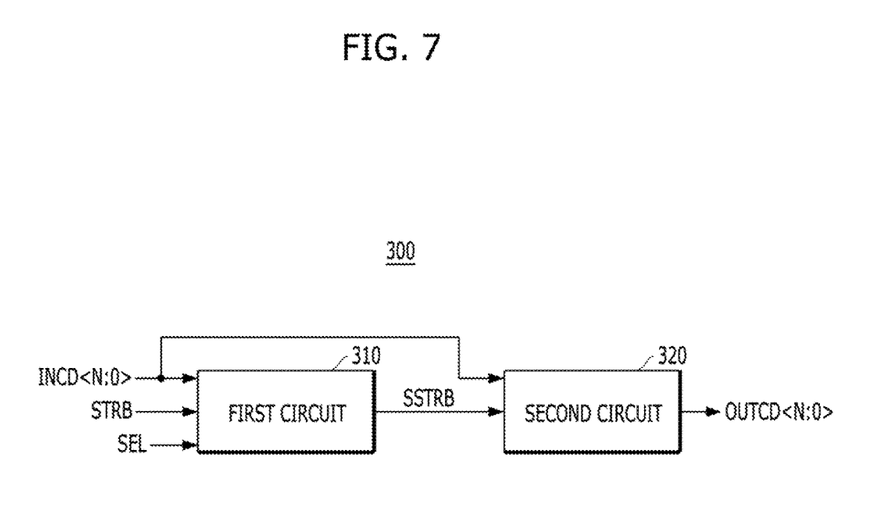
FIG. 7 is a block diagram of a semiconductor device in accordance with a third embodiment.

FIG. 7 illustrates a block diagram of a semiconductor device 300 in accordance with a third embodiment.

Referring to FIG. 7, the semiconductor device 300 may include a first circuit 310, and a second circuit 320.

The first circuit 310 may tune a strobe signal STRB depending on a change of an input code signal INCD<N:0> based on a mode select signal SEL. For example, the first circuit 310 may detect whether the input code signal INCD<N:0> has been transitioned each time the strobe signal STRB toggles. Based on a result of the detection and the mode select signal SEL, the first circuit 310 may generate a tuning strobe signal SSTRB obtained by selectively limiting a toggling period of one cycle of the strobe signal STRB, or may generate a tuning strobe signal SSTRB obtained by delaying the strobe signal STRB by a first delay time or a second delay time.

In some embodiments, the input code signal INCD<N:0> may be a data signal which is generated regardless of a clock signal, and the strobe signal STRB may be generated based on the dock signal. For example, the input code signal INCD<N:0> may include a temperature code signal which is periodically generated and updated from a temperature sensor (not shown).

The second circuit 320 may synchronize the input code signal INCD<N:0> based on the tuning strobe signal SSTRB and output an output code signal OUTCD<N:0>.

Figure 8:
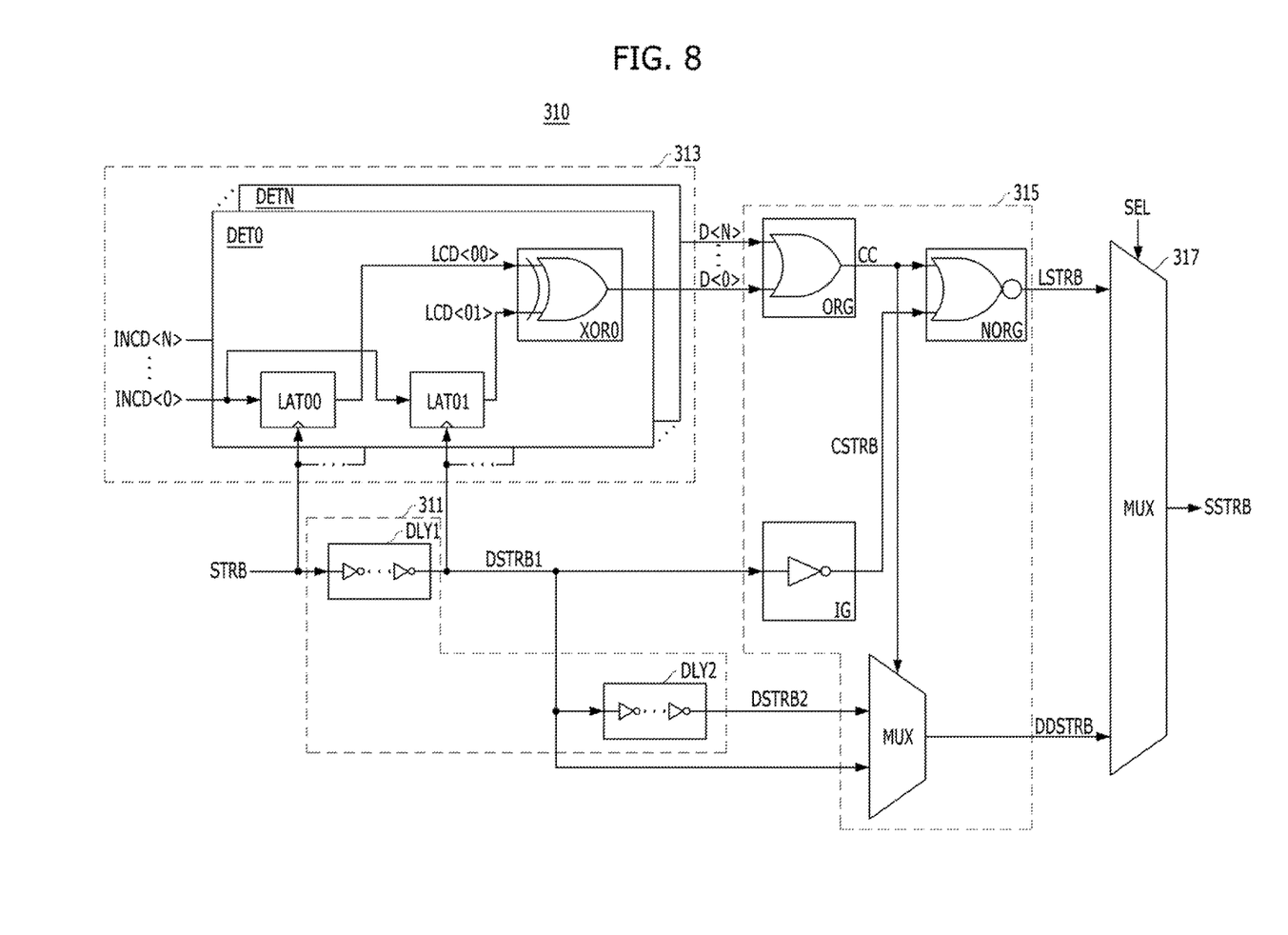
FIG. 8 is a circuit diagram of a first circuit shown in FIG. 7.

In FIG. 8, there is illustrated a circuit diagram of the first circuit 310 shown in FIG. 7.

Referring to FIG. 8, the first circuit 310 may include a delay block 311, a detection block 313, a tuning block 315, and a select block 317.

The delay block 311 may generate a first delay strobe signal DSTRB1 by delaying the strobe signal STRB by the first delay time, and may generate a second delay strobe signal DSTRB2 by delaying the strobe signal STRB by the second delay time. In some embodiments, the first delay time may be set to be longer than the transition time of the input code signal INCD<N:0>, and the second delay time may be set to longer than the first delay time. The delay block 311 has the same configuration as that of the delay block 211 described in the second embodiment; therefore, detailed description thereof will be omitted.

The detection block 313 may detect whether the input code signal INCD<N:0> has been transitioned, based on the strobe signal STRB and the first delay strobe signal DSTRB1, and may generate a detection code signal D<N:0> corresponding to a result of the detection. For example, the detection block 313 may include first to (N+1)-th transition detection units DET0 to DETN. The first to (N+1)-th transition detection units DET0 to DETN may respectively generate first to (N+1)-th detection signals included in the detection code signal D<N:0>, based on first to (N+1)-th input: signals INCD<N:0> included in the input code signal INCD<N:0>. The first to (N+1)-th transition detection units DET0 to DETN have the same configuration as those of the first to (N+1)-th transition detection units DET0 to DETN described in the second embodiment; therefore, detailed description thereof will be omitted.

Based on the first and second delay strobe signals DSTRB1 and DSTRB2 and the detection code signal D<N:0>, the tuning block 315 may generate a limit strobe signal LSTRB in which a toggling period of the first delay strobe signal DSTRB1 is selectively limited, and may generate a delay strobe signal DDSTRB corresponding to either the first delay strobe signal DSTRB1 or the second delay strobe signal DSTRB2. For example, the tuning block 315 may include a common control unit ORG, a compensation unit IG, a gating unit NORG, and a select unit MUX. The common control unit ORG may generate a common control signal CC based on the detection code signal D<N:0>. For example, the common control unit ORG may include an OR gate. The compensation unit IG may generate a compensation strobe signal CSTRB by compensating for an output timing of the first delay strobe signal DSTRB1 by a time corresponding to an operating time of the common control unit ORG. For instance, the compensation unit IG may include one or more inverters coupled in series. The gating unit NORG may generate a limit strobe signal LSTRG by gating the compensation strobe signal CSTRB based on the common control signal CC. For example, the gating unit NORG may include an NOR gate. The select unit MUX may select either the first delay strobe signal DSTRB1 or the second delay strobe signal DSTRB2 as the delay strobe signal DDSTRB based on the common control signal CC. For example, the select unit MUX may include a multiplexer.

The select block 317 may select either the limit strobe signal LSTRB or the delay strobe signal DDSTRB as the tuning strobe signal SSTRB based on a mode select signal SEL indicating a first mode or a second mode. For example, the select block 317 may include a multiplexer.

Hereinafter, the operation of the semiconductor device 300 in accordance with the third embodiment having the above-mentioned configuration will be described with reference to FIGS. 9 and 10.

Figure 9:
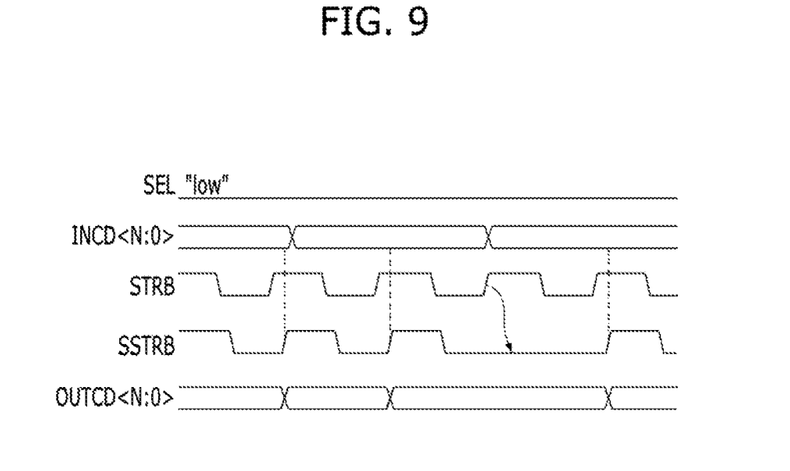
FIGS. 9 and 10 are timing diagrams illustrating operation of the semiconductor device shown in FIG. 7.
Figure 10:
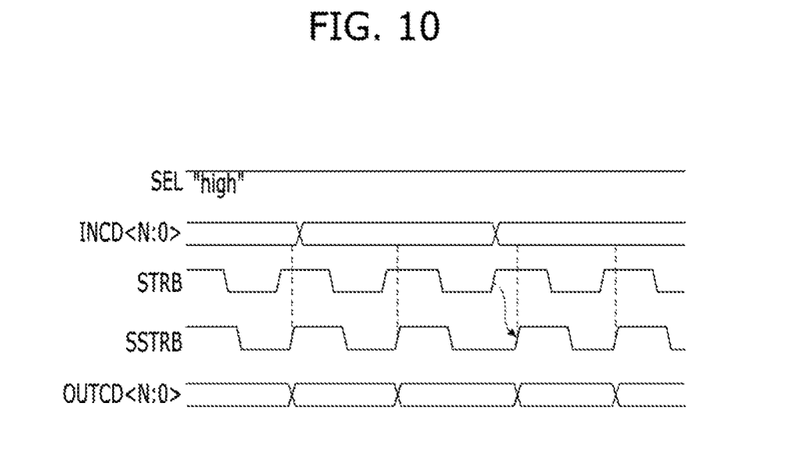

FIG. 9 is a timing diagram illustrating the operation of the semiconductor device 300 according to a first mode of the semiconductor device 300 by the mode select signal SEL. FIG. 10 is a timing diagram illustrating the operation of the semiconductor device 300 according to a second mode of the semiconductor device 300 by the mode select signal SEL.

The operation of the semiconductor device 300 according to the first mode is almost the same as that of the semiconductor device 100 in accordance with the first embodiment (refer to FIG. 3). The operation of the semiconductor device 300 according to the second mode is almost the same as that of the semiconductor device 200 in accordance with the second embodiment (refer to FIG. 6). Therefore, the description of the operation of the semiconductor device 300 according to the first or second mode will be omitted.

However, it is noted that the first mode corresponds to the case in which a mode select signal SEL having a low logic level is generated, and a tuning strobe signal SSTRB generated in the first mode corresponds to the limit strobe signal LSTRB described in the first embodiment (FIG. 9). Furthermore, it is noted that the second mode corresponds to the case in which a mode select signal SEL having a high logic level is generated, and a tuning strobe signal SSTRB generated in the second mode corresponds to the delay strobe sign& DDSTRB described in the second embodiment (FIG. 10).

As described above, according to embodiments, there is an advantage in that an input code signal which is generated or updated at a time period regardless of a strobe signal may always be normally latched.

In various embodiments, a data signal which is generated regardless of a clock signal may be always normally synchronized, whereby the operating reliability of the semiconductor device may be enhanced.

Although various embodiments have been described for illustrative purposes, it will be apparent to those skilled in the art that various changes and modifications may be made without departing from the spirit and scope of the disclosure as defined in the following claims.

What is claimed is:

1. A semiconductor device comprising:
   a first circuit suitable for generating a limit strobe signal by limiting a toggling period of a strobe signal depending on a change of an input code signal; and
   a second circuit suitable for synchronizing the input code signal based on the limit strobe signal and outputting a synchronized input code signal as an output code signal.

2. The semiconductor device of claim 1, wherein the first circuit detects whether the input code signal has been transitioned each time the strobe signal toggles, and selectively limits a toggling period of one cycle of the strobe signal depending on a result of the detection.

3. The semiconductor device of claim 1, wherein the first circuit comprises:
   a delay block suitable for generating a delay strobe signal by delaying the strobe signal by a predetermined delay time;
   a detection block suitable for detecting whether the input code signal has been transitioned based on the strobe signal and the delay strobe signal, and generating a detection code signal corresponding to a result of the detection; and
   a limit block suitable for selectively limiting a toggling period of the delay strobe signal based on the detection code signal.

4. The semiconductor device of claim 3, wherein the delay time is set to be longer than a transition time of the input code signal.

5. The semiconductor device of claim 3,
   wherein the detection block comprises at least one transition detection unit, and
   wherein the transition detection unit comprises:
   a first latch suitable for latching one or more input signals included in the input code signal as a first latch signal based on the strobe signal;
   a second latch suitable for latching the input signal as a second latch signal based on the delay strobe signal; and a comparator suitable for comparing a logic level of the first latch signal with a logic level of the second latch signal and generating one or more detection signals included in the detection code signal.

6. The semiconductor device of claim 3, wherein the limit block comprises:
a gating control unit suitable for generating gating control a signal based on the detection code signal;
a compensation unit suitable for generating a compensation strobe signal by compensating for an output timing of the delay strobe signal by a time corresponding to an operating time of the gating control unit; and
a gating unit suitable for generating the limit strobe signal by gating the compensation strobe signal based on the gating control signal.

7. The semiconductor device of claim 1, wherein the second circuit retains a preceding value of the input code signal based on the limit strobe signal, or latches a current value of the input code signal.

8. A semiconductor device comprising:
a first circuit suitable for generating a delay strobe signal by delaying a strobe signal by a first delay time or a second delay time depending on a transition of an input code signal; and
a second circuit suitable for synchronizing the input code signal based on the delay strobe signal and outputting a synchronized input code signal as an output code signal.

9. The semiconductor device of claim 8, wherein the first circuit detects whether the input code signal has been transitioned each time the strobe signal toggles, and delays the strobe signal by the first delay time or the second delay time depending on a result of the detection.

10. The semiconductor device of claim 8, wherein the first circuit comprises:
a delay block suitable for generating a first delay strobe signal by delaying the strobe signal by the first delay time, and generating a second delay strobe signal by delaying the strobe signal by the second delay time;
a detection block suitable for detecting whether the input code signal has been transitioned based on the strobe signal and the first delay strobe signal, and generating a detection code signal corresponding to a result of the detection; and
a select block suitable for selecting any one of the first delay strobe signal and the second delay strobe signal as the delay strobe signal based on the detection code signal.

11. The semiconductor device of claim 10,
wherein the first delay time is set to be longer than a transition time of the input code signal, and
wherein the second delay time is set to be longer than the first delay time.

12. The semiconductor device of claim 10, wherein the delay block comprises:
a first delay unit suitable for generating the first delay strobe signal by delaying the strobe signal by the first delay time; and
a second delay unit suitable for generating the second delay strobe signal by delaying the first delay strobe signal by a third delay time including a time obtained by subtracting the first delay time from the second delay time.

13. The semiconductor device of claim 10,
wherein the detection block comprises at least one transition detection unit, and
wherein the transition detection unit comprises:

a first latch suitable for latching one or more input signals included in the input code signal as a first latch signal based on the strobe signal;
a second latch suitable for latching the input signal as a second latch signal based on the delay strobe signal; and
a comparator suitable for comparing a logic level of the first latch signal with a logic level of the second latch signal and generating one or more detection signals included in the detection code signal.

14. The semiconductor device of claim 10, wherein the select block comprises:
a select control unit suitable for generating a select control signal based on the detection code signal; and
a select unit suitable for selecting any one of the first delay strobe signal and the second delay strobe signal as the delay strobe signal based on the select control signal.

15. A semiconductor device comprising:
a first circuit suitable for generating a tuning strobe signal by limiting a toggling period of a strobe signal or generating the tuning strobe signal by delaying the strobe signal by a predetermined delay time, based on a mode select signal and an input code signal; and
a second circuit suitable for synchronizing the input code signal based on the tuning strobe signal and outputting an output code signal.

16. The semiconductor device of claim 15, wherein the first circuit comprises:
a delay block suitable for generating a first delay strobe signal by delaying the strobe signal by the first delay time, and generating a second delay strobe signal by delaying the strobe signal by the second delay time;
a detection block suitable for detecting whether the input code signal has been transitioned based on the strobe signal and the first delay strobe signal, and generating a detection code signal corresponding to a result of the detection;
a tuning block suitable for generating a limit strobe signal in which a toggling period of the first delay strobe signal is selectively limited, based on the first and second delay strobe signals and the detection code signal, and generating a delay strobe signal corresponding to any one of the first delay strobe signal and the second delay strobe signal; and
a select block suitable for selecting any one of the limit strobe signal and the delay strobe signal as the tuning strobe signal based on the mode select signal.

17. The semiconductor device of claim 16,
wherein the detection block detects whether the input code signal has been transitioned each time the strobe signal toggles, and
wherein the tuning block generates the limit strobe signal by selectively limiting a toggling period of one cycle of the strobe signal, based on the detection code signal, and generates the delay strobe signal by delaying the strobe signal by the first delay time or the second delay time.

18. The semiconductor device of claim 16,
wherein the detection block comprises at least one transition detection unit, and
wherein the transition detection unit comprises:
a first latch suitable for latching one or more input signals included in the input code signal as a first latch signal based on the strobe signal;
a second latch suitable for latching the input signal as a second latch signal based on the first delay strobe signal; and comparator suitable for comparing a logic level of the first latch signal with a logic level of the second latch signal and generating one or more detection signals included in the detection code signal.

19. The semiconductor device of claim 16, wherein the tuning block comprises:
   a common control unit suitable for generating a common control signal based on the detection code signal;
   a compensation unit suitable for generating a compensation strobe signal by compensating for an output timing of the first delay strobe signal by a time corresponding to an operating time of the common control unit;
   a gating unit suitable for generating the limit strobe signal by gating the compensation strobe signal based on the common control signal; and
   a select unit suitable for selecting any one of the first delay strobe signal and the second delay strobe signal as the delay strobe signal based on the common control signal.

20. The semiconductor device of claim 16,
   wherein the first delay time is set to be longer than a transition time of the input code signal, and
   wherein the second delay time is set to be longer than the first delay time.

21. The semiconductor device of claim 15, wherein, when the limit strobe signal is selected as the tuning strobe signal, the second circuit retains a preceding value of the input code signal or latches a current value of the input code signal, based on the tuning strobe signal.

* * * * *